(12) United States Patent
Hong et al.

(10) Patent No.: US 9,570,453 B2
(45) Date of Patent: Feb. 14, 2017

(54) MEMORY DEVICE

(71) Applicant: Semiconductor Manufacturing International (Shanghai) Corporation, Shanghai (CN)

(72) Inventors: Zhongshan Hong, Shanghai (CN); Yun Yang, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 15/186,664

(22) Filed: Jun. 20, 2016

(65) Prior Publication Data

US 2016/0351579 A1    Dec. 1, 2016

Related U.S. Application Data

(63) Continuation of application No. 14/509,429, filed on Oct. 8, 2014, now Pat. No. 9,401,368.

(30) Foreign Application Priority Data

Dec. 30, 2013  (CN) .......................... 2013 1 0745799

(51) Int. Cl.
| | |
|---|---|
| *H01L 27/115* | (2006.01) |
| *H01L 21/28* | (2006.01) |
| *H01L 21/311* | (2006.01) |
| *H01L 21/3213* | (2006.01) |
| *H01L 21/768* | (2006.01) |

(Continued)

(52) U.S. Cl.
CPC ... *H01L 27/11521* (2013.01); *H01L 21/28273* (2013.01); *H01L 21/31116* (2013.01); *H01L 21/31144* (2013.01); *H01L 21/32134* (2013.01); *H01L 21/32137* (2013.01); *H01L 21/32139* (2013.01); *H01L 21/76897* (2013.01); *H01L 29/42324* (2013.01); *H01L 29/4933* (2013.01);

(Continued)

(58) Field of Classification Search
CPC .................. H01L 21/11521; H01L 29/42324; H01L 29/45; H01L 29/788; H01L 29/66825; H01L 21/28273; H01L 29/6656; H01L 21/32053; H01L 21/32135; H01L 21/32139; H01L 21/32134; H01L 21/31055; H01L 21/3212; H01L 21/0214; H01L 21/02164; H01L 21/0217; H01L 21/0332
See application file for complete search history.

(56) References Cited

U.S. PATENT DOCUMENTS

| | | |
|---|---|---|
| 2004/0065917 A1 | 4/2004 | Fan et al. |
| 2012/0146125 A1 | 6/2012 | Kim et al. |

*Primary Examiner* — Ermias Woldegeorgis
(74) *Attorney, Agent, or Firm* — Anova Law Group, PLLC

(57) ABSTRACT

Various embodiments provide memory devices and methods for forming the same. A substrate is provided, the substrate having one or more adjacent memory cells formed thereon. Each memory cell includes a gate structure, a control gate layer, and a first mask layer. A portion of the control gate layer is removed, to reduce a size of an exposed portion of the control gate layer in a direction parallel to a surface of the substrate. An electrical contact layer is formed on an exposed sidewall of the control gate layer and an exposed surface of the substrate. A barrier layer is formed on a sidewall of the memory cell. A conductive structure is formed on the substrate. The conductive structure has a significantly larger distance from control gate layer than from the gate structure, and the barrier layer forms an isolation layer between the conductive structure and the control gate layer.

10 Claims, 6 Drawing Sheets

(51) Int. Cl.
*H01L 29/423* (2006.01)
*H01L 29/66* (2006.01)
*H01L 29/788* (2006.01)
*H01L 29/49* (2006.01)

(52) U.S. Cl.
CPC ....... *H01L 29/665* (2013.01); *H01L 29/66825* (2013.01); *H01L 29/788* (2013.01)

MEMORY DEVICE

CROSS REFERENCE TO RELATED APPLICATIONS

This application is a divisional of U.S. patent application Ser. No. 14/509,429, filed on Oct. 8, 2014, which claims priority to Chinese Patent Application No. CN201310745799.2, filed on Dec. 30, 2013, the entire content of all of which is incorporated herein by reference.

FIELD OF THE DISCLOSURE

The present disclosure relates to the field of semiconductor fabrication technology and, more particularly, relates to memory devices and methods for forming the same.

BACKGROUND

In current semiconductor industry, integrated circuit (IC) products can be divided into three categories, i.e., analog circuits, digital circuits and digital/analog hybrid circuits. Memory device is an important type of digital circuits. In recent years, among memory devices, the development of flash memory is particularly rapid. A main feature of flash memory is the ability of long-term information storage without electric power. Therefore, flash memory has been widely applied to memory devices that need to retain stored data without losing the data due to a power outage and need to repeatedly read and write data. In addition, flash memory has a number of advantages such as high degree of integration, fast access speed, and ease of erasing and rewriting. Thus, flash memory devices are widely applied in many areas such as microcomputers, and automated control. Accordingly, how to improve performance of flash memory and reduce cost has become an important issue.

Furthermore, developing high-density flash memory technology can help to improve the performance of various types of portable electronic devices. For example, flash memory is used as a storage device in electronic devices such as digital camera, laptop computer, or tablet computer. Therefore, reducing the size of a flash memory cell and thus reducing the cost of the flash memory cell is one of the directions of technological development. For NOR gate ETOX (i.e., electrically erasable programmable read-only memory with tunnel oxide layer, EPROM with Tunnel Oxide, or Erase Through Oxide) flash memory, using a self-aligned electrical contact (i.e., Self-Align Contact) process can reduce the size of the flash memory cell.

FIG. 1 depicts a cross-sectional view of a flash memory device formed using a self-aligned electrical contact process. The flash memory device includes a substrate 100 and one or more adjacent memory cells 101 on the surface of the substrate 100. One memory cell 101 includes a tunnel oxide layer 110 on the surface of the substrate 100, a floating gate layer 111 on the surface of the tunnel oxide layer 110, an insulating layer 112 on the surface of the floating gate layer 111, a control gate layer 113 on the surface of the insulating layer 112, and a silicon nitride layer 114 on the surface of the control gate layer 113.

In addition, the flash memory device includes a source region or a drain region 102 within the substrate 100 between adjacent memory cells 101. The flash memory device further includes sidewall spacers 103 on the surface of the substrate 100 at both sides of the memory cells 101. The flash memory device further includes an electrical interconnect structure 105 on the surface of the sidewall spacers 103, on the surface of the silicon nitride layer 114, and on the surface of the substrate 100 between the adjacent memory cells 101.

However, the flash memory device formed using existing technology still has relatively low stability and poor reliability. The disclosed methods and structures are directed to solve one or more problems set forth above and other problems.

BRIEF SUMMARY OF THE DISCLOSURE

One aspect of the present disclosure includes methods for forming a memory device. In an exemplary method, a substrate can be provided. One or more adjacent memory cells can be formed on the substrate. Each memory cell can include a gate structure on the substrate, a control gate layer on the gate structure, and a first mask layer covering the control gate layer. A portion of the control gate layer can be removed, without removing any portion of the gate structure, to reduce a size of an exposed portion of the control gate layer in a direction parallel to a surface of the substrate. After removing the portion of the control gate layer, an electrical contact layer can be formed on an exposed sidewall of the control gate layer and on an exposed surface of the substrate. A barrier layer can be formed on the substrate, a sidewall of the gate structure, and the sidewall of the exposed sidewall of the control gate layer. A conductive structure can be formed to connect the gate structure through the substrate such that a distance between the conductive structure and the control gate layer can be significantly larger than a distance between the conductive structure and the gate structure, and the barrier layer can form an isolation layer between the conductive structure and the control gate layer.

Another aspect of the present disclosure includes memory devices. An exemplary device can include a substrate and one or more adjacent memory cells on the substrate. A memory cell of the one or more adjacent memory cells can include a gate structure on the substrate, a control gate layer on the gate structure, and a first mask layer on the control gate layer. In a direction parallel to a surface of the substrate, a size of a portion of the control gate layer can be smaller than a size of the gate structure or the first mask layer. The device can further include an electrical contact layer on a sidewall of the portion of the control gate layer and on an exposed surface of the substrate. The device can further include a barrier layer on the substrate and a sidewall of the memory cell. The barrier layer can have an opening therein. The opening can expose at least the electrical contact layer on the surface of the substrate on both sides of the memory cell. The device can further include a conductive structure in the opening, such that a distance between the conductive structure and the control gate layer can be significantly larger than a distance between the conductive structure and the gate structure, and the barrier layer can form an isolation layer between the conductive structure and the control gate layer.

Other aspects or embodiments of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Figure 1:
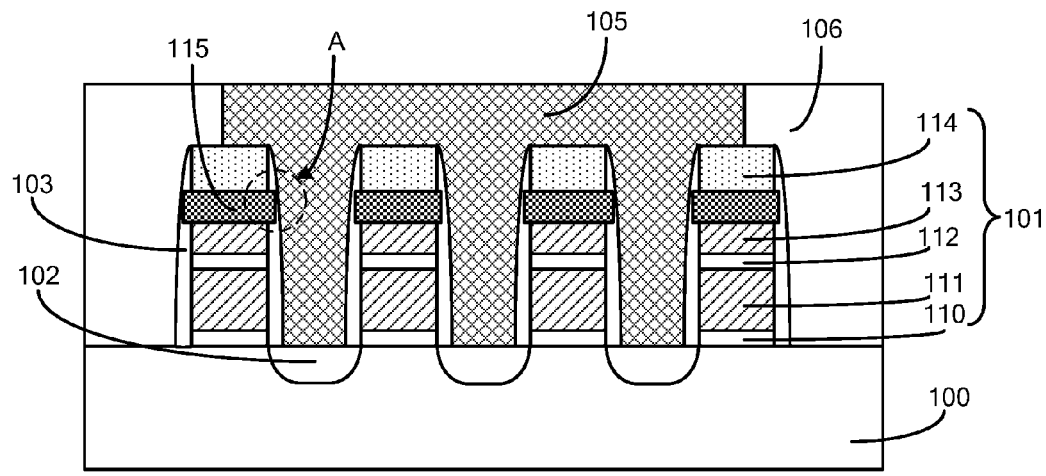
FIG. 1 depicts a cross-sectional view of a flash memory device formed using a self-aligned electrical contact process.

Flash memory devices formed using existing technology (as shown in FIG. 1) still have relatively low stability and poor reliability. With the reducing of size and the increasing of density of semiconductor devices, the cross-sectional area of the control gate layer 113 in a direction vertical to the surface of the substrate 100 may be reduced, which may cause the resistivity or resistance of the control gate layer 113 to be increased. In order to reduce the resistance of the control gate layer 113 and accordingly to improve performance and stability of the flash memory device and reduce energy consumption and heat loss, a metal silicide layer 115 can be formed in the control gate layer 113 using a self-aligned silicide process. The formed metal silicide layer 115 is located on the surface of a portion of the sidewall of the control gate layer 113.

Further, with the reducing of size and the increasing of density of semiconductor devices, the distance between adjacent memory cells 101 is reduced, such that the space between the adjacent memory cells 101 is not sufficient to form a conductive plug for connecting a source region or a drain region 102. In order to accomplish the electrical connection to the source region or the drain region 102, as shown in FIG. 1, an electrical interconnect structure 105 needs to be formed using a self-aligned electrical contact process.

In specific, still referring to FIG. 1, the self-aligned electrical contact process can include the following steps. A dielectric layer 106 can be formed on the surface of the substrate 100, the surface of sidewall spacers 103, and the surface of the memory cells 101. A photoresist layer (not shown) can be formed on the surface of the dielectric layer 106. The photoresist layer can expose position(s) corresponding to the one or more memory cells 101. The dielectric layer 106 can be etched using the photoresist layer as an etching mask, until the surface of the silicon nitride layer 114 and the surface of the substrate 100 is exposed, to form an opening (not labeled) in the dielectric layer 106. The electrical interconnect structure 105 can be formed in the opening.

The formed electrical interconnect structure 105 can be in contact with the surface of the substrate 100, and thus can apply a voltage to the source region or the drain region 102. In addition, the electrical interconnect structure 105 can be electrically isolated from the floating gate layer 111 by the sidewall spacers 103, and can be electrically isolated from the control gate layer 113 by the silicon nitride layer 114 and the sidewall spacers 103. The silicon nitride layer 114 can protect the top surface of the control gate layer 113 during the etching of the dielectric layer 106 to form the opening. In addition, the silicon nitride layer 114 can achieve electrical isolation between the control gate layer 113 and the electrical interconnect structure 105 that is subsequently formed in the opening. The electrical interconnect structure 105 formed using the self-aligned electrical contact process is located in the opening. The electrical interconnect structure 105 is electrically isolated from the control gate layer 113 and the metal silicide layer 115 via the sidewall spacers 103.

However, because the metal silicide layer 115 is formed by the self-aligned silicide process, during the self-aligned silicide process, a metal layer needs to be formed on the surface of the sidewall of the control gate layer 113. Via an annealing process, metal atoms in the metal layer are diffused into the control gate layer 113 and are caused to react with the material of the control gate layer 113 to form a metal silicide.

Referring to region A in FIG. 1, because metal atoms are added into the control gate layer 113, the surface of the metal silicide layer formed in the control gate layer 113 can often protrude beyond the surface of the sidewall of the floating gate layer 111 and of the silicon nitride layer 114. That is, the silicon nitride layer 114 is not able to completely block or protect the metal silicide layer 115. When the electrical interconnect structure 105 is formed using the self-aligned electrical contact process, the opening formed by etching the dielectric layer 106 can easily thin the surface dielectric layer (the surface dielectric layer can include, e.g., the sidewall spacers 103), and can even expose the metal silicide layer 115, such that the distance between the subsequently-formed electrical interconnect structure 105 and the metal silicide layer 115 is reduced or the electrical interconnect structure 105 and the metal silicide layer 115 can even directly contact each other. Thus, a leakage current is generated between the electrical interconnect structure 105 and the metal silicide layer 115. Accordingly, the performance of the formed flash memory device often declines and reliability of the flash memory device is often reduced.

The various disclosed embodiments provide improved methods for forming a memory device. In an exemplary method, a second mask layer can be formed on the surface of a sidewall of a memory cell. The second mask layer can cover a sidewall of the first dielectric layer, a floating gate layer and a second dielectric layer. Further, the second mask layer can cover a portion of a control gate layer closer to the floating gate layer. Before an electrical contact layer is formed, a portion of the control gate layer can be removed using a first mask (or a first mask layer) and a second mask (or a second mask layer) as a mask, such that the size of an exposed portion of the control gate layer in a direction parallel to the surface of the substrate can be reduced.

Because the size of the exposed portion of the control gate layer in the direction parallel to the surface of the substrate is reduced, i.e., the exposed sidewall of the control gate layer can be recessed with respect to the sidewall of the floating gate layer and the sidewall of the first mask layer, after the electrical contact layer is formed using a salicide process, the surface of the electrical contact layer is not protruded beyond the sidewall surface of the floating gate layer and the sidewall surface of the first mask layer, such that the first mask layer can substantially completely cover the electrical contact layer on the sidewall surface of the control gate layer. Accordingly, during the subsequent forming of an opening in a third dielectric layer, the electrical contact layer located on the surface of the sidewall of the control gate layer can be protected by the first mask layer and a barrier layer, such that the sidewall of the opening does not expose the electrical contact layer. Further, there can be a barrier layer having a sufficient thickness on the surface of the electrical contact layer for isolating a subsequently-formed conductive structure.

Accordingly, after the conductive structure is subsequent formed, there can be desired electrical isolation between the conductive structure and the electrical contact layer on the surface of the sidewall of the control gate layer. A leakage current is less likely to be generated. Thus, the formed memory device can have stable performance and improved reliability.

Figure 10:
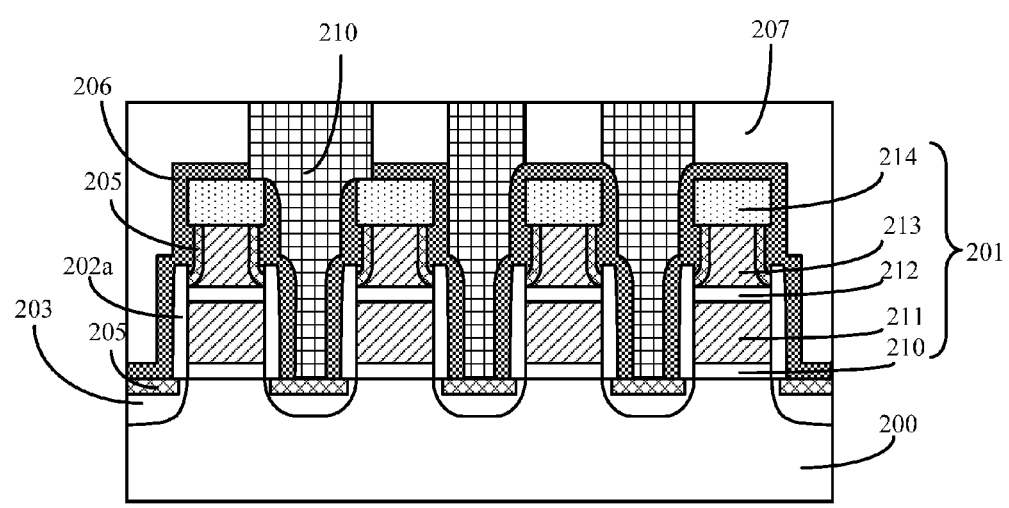
Figure 11:
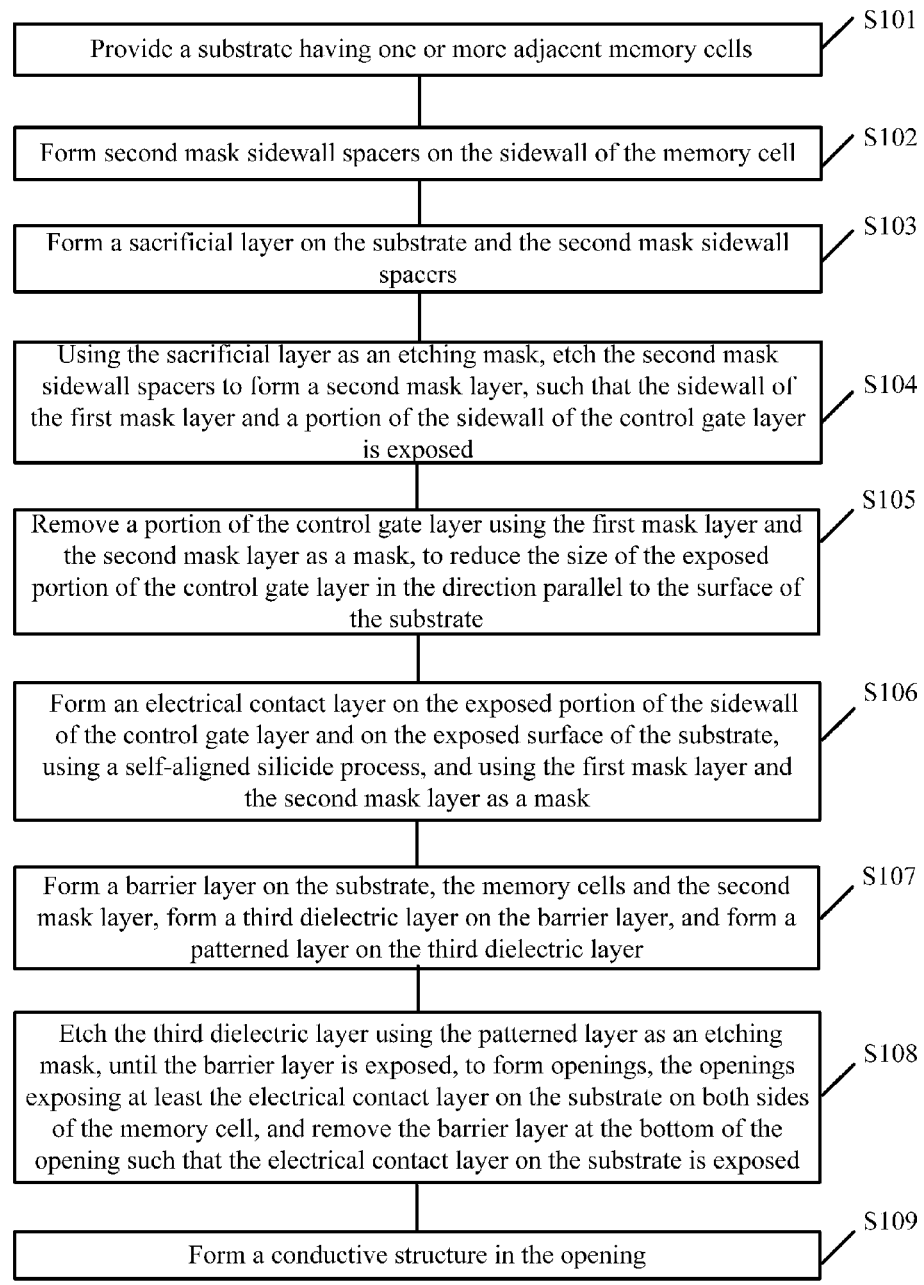
FIG. 11 depicts a flow diagram of an exemplary method for forming a memory device in accordance with various disclosed embodiments.

FIG. 11 depicts a flow diagram of an exemplary method for forming a memory device in accordance with various disclosed embodiments. FIGS. 2-10 depict cross-sectional views of the memory device at various stages during a fabrication process in accordance with various disclosed embodiments. Note that although FIGS. 2-10 depict semiconductor structures corresponding to the method depicted in FIG. 11, the semiconductor structures and the method are not limited to one another in any manner.

In certain parts of the present disclosure, a self-aligned silicide process can also be referred to as a salicide process. A self-aligned electrical contact process can also be referred to as a self-aligned contact process.

In certain parts of the present disclosure, wherever applicable, the sidewall surface of a certain structure or component can refer to the surface of the sidewall of the certain structure or component. Diffusing metal atoms into a certain structure or component refers to diffusing the metal atoms into the interior of the certain structure or component.

Figure 2:
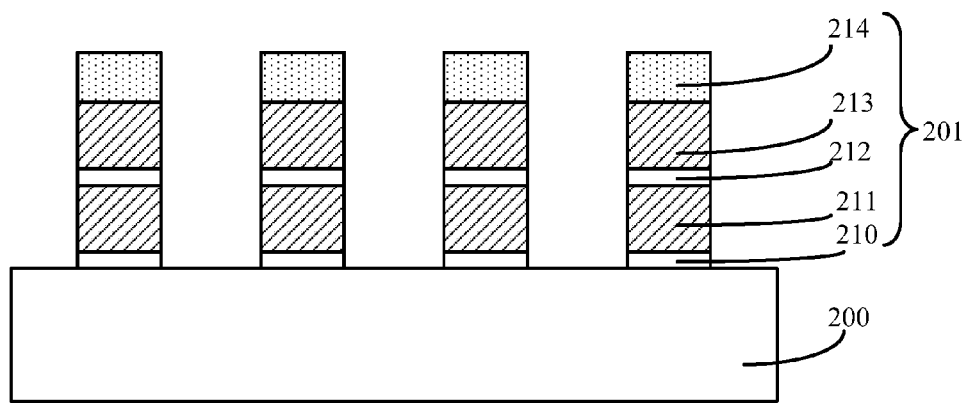
FIGS. 2-10 depict cross-sectional views of an exemplary memory device at various stages during a fabrication process in accordance with various disclosed embodiments.

In Step S101 of FIG. 11 and referring to FIG. 2, a substrate 200 is provided. The surface of the substrate 200 has one or more memory cells 201 thereon. A memory cell 201 can include a first dielectric layer 210 on the surface of the substrate 200, a floating gate layer 211 on the surface of the first dielectric layer 210, a second dielectric layer 212 on the surface of the floating gate layer 211, a control gate layer 213 on the surface of the second dielectric layer 212, and a first mask layer 214 on the surface of the control gate layer 213. The first dielectric layer 210, the floating gate layer 211, and the second dielectric layer 212 can form a gate structure.

For example, the substrate 200 can include a silicon substrate, a silicon-germanium substrate, a silicon carbide substrate, a silicon-on-insulator (SOI) substrate, a germanium-on-insulator (GOI) substrate, a glass substrate, and/or a III-V group compound substrate, e.g., gallium nitride, gallium arsenide, and/or the like.

A memory device formed by the memory cell 201 can be a NOR gate ETOX (i.e., electrically erasable programmable read-only memory with tunnel oxide layer, EPROM with Tunnel Oxide, or Erase Through Oxide) flash memory device. The first dielectric layer 210 can be made of a material including silicon oxide. The first dielectric layer 210 can form a tunnel oxide layer. Via the first dielectric layer 210, electrons can migrate between the floating gate layer 211 and a channel region in the substrate 200, to implement operations including, writing, erasing, programming, or the like.

The floating gate layer 211 can be made of a material including polysilicon. Electrons can be stored in the floating gate layer 211, in order to achieve storage of data without electric power. The second dielectric layer 212 can be used for isolating the floating gate layer 211 and the control gate layer 213.

The second dielectric layer 212 can be made of a material including silicon oxide, silicon nitride, silicon oxynitride, or a combination thereof. In one embodiment, the second dielectric layer 212 can be formed using a silicon oxide layer, a silicon nitride layer on the surface of the silicon oxide layer, and a silicon oxide layer of the surface of the silicon nitride layer. That is, the second dielectric layer 212 can have a silicon oxide-silicon nitride-silicon oxide (ONO) structure. The ONO structure can have a strong isolation ability, and a desired ability of binding with polysilicon material. Thus, the ONO structure can effectively isolate the control gate layer 213 and the floating gate layer 211, and can control the binding between the control gate layer 213 and the floating gate layer 211 to be stable.

The control gate layer 213 can be made of a material including polysilicon. The control gate layer 213 can be used for applying a bias voltage to the floating gate layer 211 and, via various bias voltages, control the floating gate layer 211 at the bottom to implement specific operations including, writing, erasing, programming, or the like.

For example, a process for forming the memory cell 201 can include the following steps. A first dielectric film can be formed on the surface of the substrate 200. A first polysilicon film can be formed on the surface of the first dielectric film. A second dielectric film can be formed on the surface of the first polysilicon film. A second polysilicon film can be formed on the surface of the second dielectric film. The first mask layer 214 can be formed on the surface of the second polysilicon film. The first mask layer 214 can cover a corresponding position where the memory cell 201 needs to be formed. Using the first mask layer 214 as an etching mask, the second polysilicon film, the second dielectric film, the first polysilicon film, and the first dielectric film can be etched using an anisotropic dry etching process until the surface of the substrate 200 is exposed, to form the first dielectric layer 210, the floating gate layer 211, the second dielectric layer 212, and the control gate layer 213 on the surface of the substrate 200. During the etching process, the first polysilicon film can be etched to form the floating gate layer 211, and the second polysilicon film can be etched to form the control gate layer 213.

For example, a process for forming the second polysilicon film, the second dielectric film, the first polysilicon film, and the first dielectric film can include a chemical vapor deposition process and/or a physical vapor deposition process. In addition, the first dielectric film can be formed by a thermal oxidation process and/or a wet oxidation process.

The first mask layer 214 can further protect the top surface of the control gate layer 213 during the subsequent forming of a conductive structure on the substrate 200 between adjacent memory cells 201. Thus, the control gate layer 213 can be electrically isolated from the conductive structure formed on the top of the memory cell 201.

The first mask layer 214 can be made of a material including silicon oxide, silicon nitride, silicon oxynitride, or a combination thereof. In one embodiment, the first mask layer 214 can be made of a material including silicon nitride. For example, a process for forming the first mask layer 214 can include the following steps. A first mask film can be formed on the surface of the second polysilicon film. A photoresist layer can be formed on the surface of the first mask film. The photoresist layer can be exposed to be patterned. Using the patterned photoresist layer as an etching mask, the first mask film can be etched using an anisotropic dry etching process until the second polysilicon film is exposed, to form the first mask layer 214.

Figure 3:
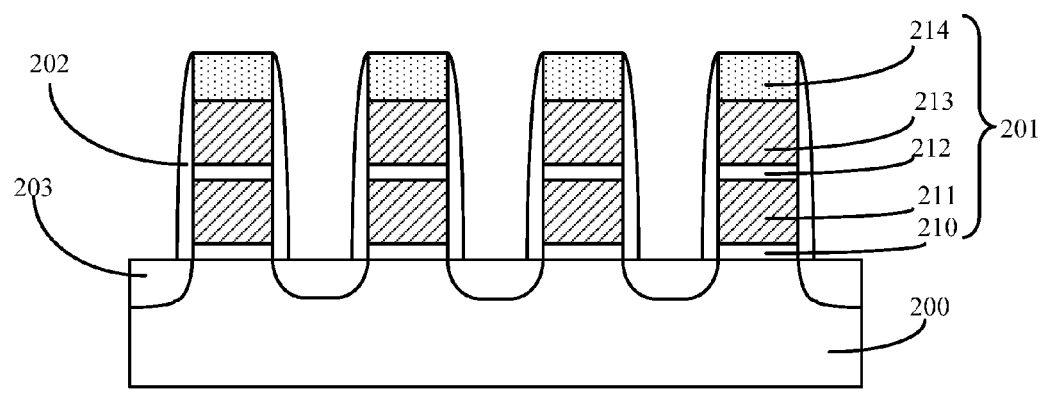

In Step S102 of FIG. 11 and referring to FIG. 3, one or more second mask sidewall spacers 202 are formed on the surface of the sidewalls of the memory cell 201. The second mask sidewall spacers 202 can be used for forming a second mask layer. The second mask layer can define a sidewall region of the control gate layer 213 where an electrical contact layer needs to be formed using a salicide (Self-Align Silicide) process.

A process for forming the second mask sidewall spacers 202 can include the following steps. A second mask can be formed on the surface of the substrate 200 and the memory cell 201. The second mask can be etched back using an etch-back process until the top surface of the first mask layer 214 and the surface of the substrate 200 are exposed, to form the second mask sidewall spacers 202. The etch-back process can include an anisotropic dry etching process, and can have an etching direction perpendicular to the direction of the surface of the substrate 200. At the same time of removing the second mask on the surface of the substrate 200 and at the top of the first mask layer 214, a portion of the second mask can be retained at the sidewall of the memory cell 201 to form the second mask sidewall spacers 202. A process for forming the second mask can include a chemical vapor deposition process, an atomic layer deposition process, and/or a physical vapor deposition process.

The second mask sidewall spacers 202 can be made of a material including silicon oxide, silicon nitride, silicon oxynitride, or a combination thereof. Further, the material of the first mask layer 214 can be different from the material of the second mask sidewall spacers 202. That is, the first mask layer 214 can be made of a material different from the material that the second mask sidewall spacers 202 is made of. Thus, there can be an etching selectivity between the first mask layer 214 and the second mask sidewall spacers 202. When the second mask is etched back, the etching back does not cause excessive damage to the first mask layer 214, such that the protective effect of the first mask layer 214 in a subsequent process can be ensured.

In one embodiment, before a sacrificial layer is subsequently formed, by using the first mask layer 214 and the second mask sidewall spacers 202 as a mask, one or more doped regions 203 can be formed in the substrate 200 on both sides of the memory cells 201 and the second mask sidewall spacers 202. The doped regions 203 can contain P-type ions or N-type ions. The doped regions 203 can be the source region and the drain region in the substrate 200 at both sides of the memory cell 201. A subsequently-formed conductive structure can be located on the surface of the source region and the drain region, to be used for turning on a channel region at the bottom of the memory cell 201 in order to select the memory cell 201 for an operation.

A process for forming the doped region 203 can include the following steps. P-type ions or N-type ions can be doped in the substrate 200 at both sides of the memory cell 201 by an ion implantation process, using the first mask layer 214 and the second mask sidewall spacers 202 as a mask, to form lightly-doped region(s) 203.

In certain embodiments, the doping concentration of the P-type ions or the N-type ions in the doped region 203 can be relatively light. Thus, in this case, a doped region 203 can also be referred to as a lightly-doped region 203.

Figure 4:
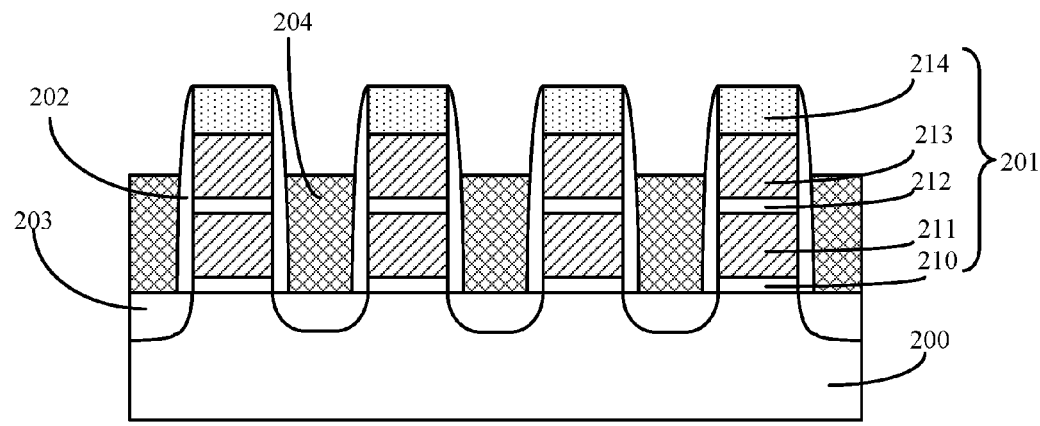

In Step S103 of FIG. 11 and referring to FIG. 4, a sacrificial layer 204 is formed on the surface of the substrate 200 and the second mask sidewall spacers 202. The sacrificial layer 204 can expose the second mask sidewall spacers 202 on the surface of the sidewall of the first mask layer 214, and a portion of the second mask sidewall spacers 202 on the surface of the sidewall of the control gate layer 213 and close to (i.e., adjacent to) the first mask layer 214.

In various embodiments, the control gate layer 213 can include a first portion and a second portion on the first portion. Accordingly, the first portion is the portion of the control gate layer 213 that is adjacent to the second dielectric layer 212, and is thus close to the second dielectric layer 212 and the floating gate layer 211. The second portion is the portion of the control gate layer 213 that is adjacent to the first mask layer 214 and is thus close to the first mask layer 214.

The sacrificial layer 204 can define a sidewall region of the control gate layer 213 where the electrical contact layer needs to be formed. Subsequently, by removing the portion of the second mask sidewall spacers 202 that is not covered by the sacrificial layer 204, the surface of the sidewall of the control gate layer 213 can be exposed, such that the electrical contact layer can then be formed.

A process for forming the sacrificial layer 204 can include the following steps. A sacrificial film can be formed on the surface of the substrate 200, the memory cells 201 and the second mask sidewall spacers 202. The sacrificial film can be etched back, to form the sacrificial layer 204.

In one embodiment, the sacrificial layer 204 can be made of a material including amorphous carbon, a bottom anti-reflective coating material, and/or a photoresist. In another embodiment, the sacrificial layer 204 can be made of a material including silicon oxide, silicon nitride, silicon oxynitride, amorphous carbon, and/or a low-K dielectric material. The sacrificial layer 204 can be made of a material different from the material of the second mask sidewall spacers 202 and the first mask layer 214, such that the sacrificial layer 204 can have an etching selectivity with respect to the second mask sidewall spacers 202 and the first mask layer 214.

Further, the sacrificial layer 204 can be removed easily without producing residual material. Thus, after the sacrificial layer 204 is subsequently removed, residual material can be prevented from attaching to the surface of the substrate 200 and the control gate layer 213.

A process for forming the sacrificial film can include a chemical vapor deposition process, an atomic layer deposition process, and/or a physical vapor deposition process. Further, when the sacrificial film is made of a material including a photoresist or a bottom anti-reflective coating material, the process for forming the sacrificial film can include a spin-coating process and/or a spray-coating process.

A process for etching back the sacrificial film can include an anisotropic dry etching process. The anisotropic dry etching process can have an etching direction perpendicular to the surface of the substrate 200, such that the surface of the sacrificial film can be lowered to be below the top surface of the control gate layer 213, to form the sacrificial layer 204.

In one embodiment, the sacrificial layer 204 can be made of a material including amorphous carbon. Thus, the process for etching back the sacrificial film can have a gas including oxygen, a bias power greater than about 100 W. For example, the oxygen can bombard the sacrifice film in the form of a plasma, to react with the amorphous carbon to form carbon monoxide or carbon dioxide and be discharged.

Figure 5:
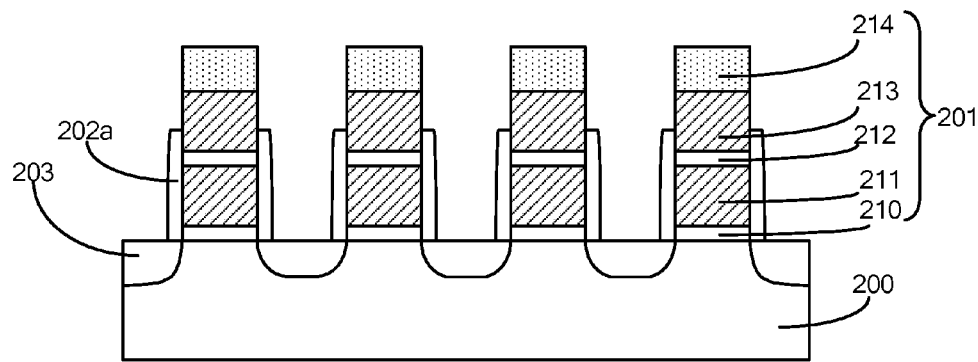

In Step S104 of FIG. 11 and referring to FIG. 5, using the sacrificial layer 204 (as shown in FIG. 4) as an etching mask, the second mask sidewall spacers 202 (as shown in FIG. 4) is etched to form a second mask layer 202a, until the sidewall surface of the first mask layer 214 and a portion of the sidewall surface of the control gate layer 213 is exposed. The second mask layer 202a can cover the sidewall of the first dielectric layer 210, the floating gate layer 211 and the second dielectric layer 212, and the portion of the sidewall surface of the control gate layer 213 that is close to the floating gate layer 211. After the second mask layer 202a is formed, the sacrificial layer 204 can be removed.

The second mask layer 202a and the first mask layer 214 together can be used as mask for a subsequent salicide process. Because the second mask layer 202a can expose the portion of the sidewall surface of the control gate layer 213 that is close to the first mask layer 214 and can expose a portion of the surface of the substrate 200 at both sides of the memory cell 201, the subsequently formed electrical contact layer can be located on a portion of the surface of the control gate layer 213 and on the surface of the substrate 200.

A process for etching the second mask sidewall spacers 202 can include an isotropic etching process. The isotropic etching process can have substantially the same etching rate in each direction, and thus can etch the second mask sidewall spacers 202 in a direction parallel to the surface of the substrate 200.

In one embodiment, the process for etching the second mask sidewall spacers 202 can include an isotropic wet etching process. The isotropic wet etching process can use an etching solution including hydrofluoric acid. The etching solution can have a temperature ranging from about 100 degrees Celsius to about 200 degrees Celsius.

In another embodiment, the process for etching the second mask sidewall spacers 202 can include an isotropic dry etching process. The isotropic dry etching process can use an etching gas including a fluorine-based gas, e.g., $CF_4$, $CF_3H$, $CFH_3$, and can have a bias power is less than about 100 W and a bias voltage less than about 10 volts.

As used herein, a fluorine-based gas can refer to a gas containing fluorine in any appropriate form. For example, the gas can have a fluorine radical, and/or the gas can have a chemical formula containing fluoro-, or F—.

In one embodiment, the portion of the control gate layer 213 that is covered by the second mask layer 202a can have a thickness greater than about ⅕ of the total thickness of the control gate layer 213. In this case, because the second mask layer 202a can substantially completely cover the sidewall of the first dielectric layer 210, the floating gate layer 211 and the second dielectric layer 212, the second mask layer 202a can protect the surface of the first dielectric layer 210, the floating gate layer 211 and the second dielectric layer 212 in the subsequent salicide process. Thus, after the metal layer is removed, residual metal material can be prevented from adhering to the sidewall of the first dielectric layer 210, the floating gate layer 211 and the second dielectric layer 212, such that the generating of leakage current can be prevented.

Further, the second mask layer 202a can cover the portion of the sidewall of the control gate layer 213 that is close to the floating gate layer 211, such that the subsequently-formed metal layer can have a certain distance from the second dielectric layer 212. Therefore, during the subsequent salicide process, after metal atoms in the metal layer on the sidewall surface of the control gate layer 213 diffuse into the control gate layer 213, the metal atoms can be prevented from continuing to diffuse into the second dielectric layer 212. Thus, leakage current can be prevented from being generated between the floating gate layer 211 and the control gate layer 213. The formed memory cells 201 can have stable performance and high reliability.

A process for removing the sacrificial layer 204 can include a dry etching process. In one embodiment, the sacrificial layer 204 can be made of a material including amorphous carbon, a bottom anti-reflective coating material, and/or a photoresist. Accordingly, the dry etching process can use an etching gas including oxygen, and can substantially completely remove the sacrificial layer 204, without attaching residual material to the surface of the control gate layer 213 and the substrate 200.

Figure 6:
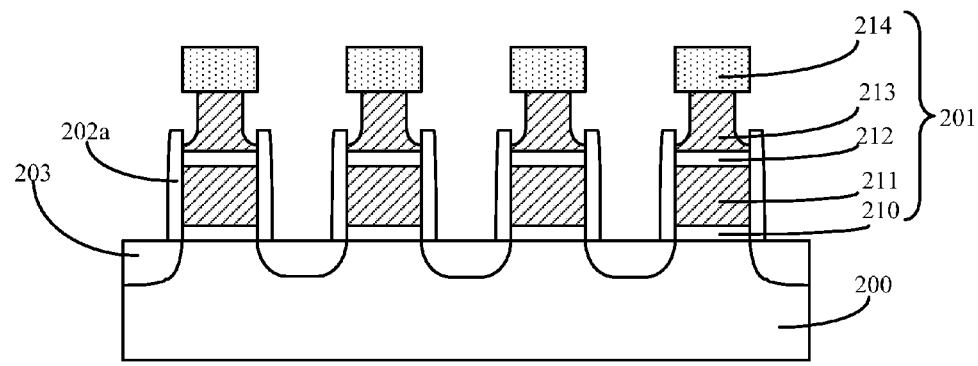

In Step S105 of FIG. 11 and referring to FIG. 6, a portion of the control gate layer 213 is removed using the first mask layer 214 and the second mask layer 202a as a mask, to reduce the size of the exposed portion of the control gate layer 213 in the direction parallel to the surface of the substrate 200.

Although in various embodiments, the second mask layer 202a is used as a mask to define the position of the portion of the control gate layer 213 that needs to be removed, the position of the portion of the control gate layer 213 to be removed can be defined and masked using any other appropriate processes, without limitation.

To reduce the resistivity of the control gate layer 213 and accordingly improve the performance of the memory cells 201, an electrical contact layer may be subsequently formed on the exposed portion of the sidewall surface of the control gate layer 213, using the salicide process and using the first mask layer 214 and the second mask layer 202a as a mask. However, during the salicide process, the metal atoms in the metal layer can diffuse from the exposed portion of the sidewall surface of the control gate layer 213 into the control gate layer 213, i.e., into the interior of the control gate layer 213. By reacting with the material of the control gate layer 213, the metal atoms can form a metal silicide layer, i.e., the electrical contact layer. Therefore, the formed electrical contact layer can include the original control gate layer 213 having the metal atoms added, which tends to cause the surface of the formed electrical contact layer to be protruded beyond the sidewall surface of the first mask layer 214. Thus the first mask layer 214 may not be able to completely cover the formed electrical contact layer. When a conductive structure is subsequently formed using a self-aligned electrical contact process, the distance between the protruded electrical contact layer and the formed conductive structure can easily be too small, and the protruded electrical contact layer and the formed conductive structure may even directly contact each other. Accordingly, the performance of the formed memory cells 201 can be caused to decline.

Therefore, in one embodiment, before the subsequent salicide process, a portion of the control gate layer 213 can be removed using the first mask layer 214 and the second mask layer 202a as a mask, such that the sidewall surface of the control gate layer 213 can be recessed with respect to the sidewall of the first mask layer 214. Thus, after the electrical contact layer is subsequently formed, the electrical contact layer can be substantially or completely covered by the first mask layer 214 in order to be protected.

The control gate layer 213 can be made of a material including polysilicon. A process for removing the portion of the control gate layer 213 can include an isotropic etching process. The isotropic etching process can have substantially the same etching rate in each direction, and thus can etch the control gate layer 213 in a direction parallel to or perpendicular to the surface of the substrate 200.

In one embodiment, the process for removing the portion of the control gate layer 213 can include an isotropic wet etching process. The isotropic wet etching process can use an etching solution containing tetramethyl ammonium hydroxide, or can use a mixed solution of nitric acid and hydrofluoric acid. The isotropic wet etching process can have a temperature ranging from about 100 degrees Celsius to about 200 degrees Celsius.

In another embodiment, the process for removing the portion of the control gate layer 213 can include an isotropic dry etching process. The isotropic dry etching process can use an etching gas including a fluorine-based gas, e.g., $CF_4$, $CF_3H$, and/or $CFH_3$, and can have a bias power less than about 100 W and a bias voltage less than about 10 volts.

Figure 7:
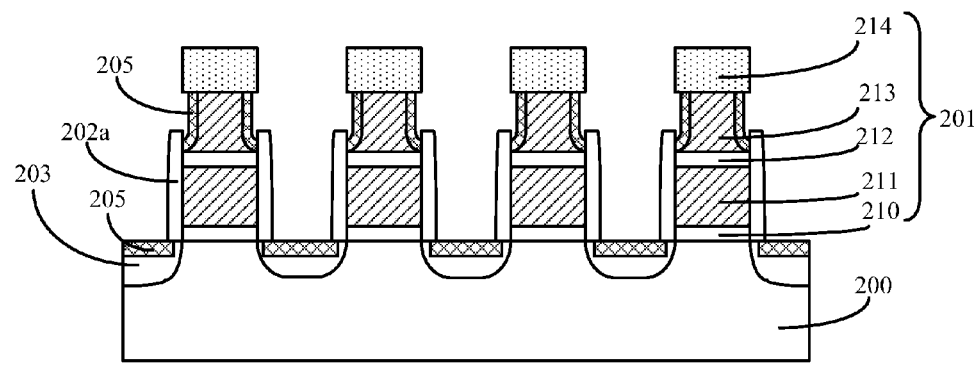

In Step S106 of FIG. 11 and referring to FIG. 7, after the portion of the control gate layers 213 is removed, an electrical contact layer 205 is formed on the exposed portion of the sidewall surface of the control gate layer 213 and on the exposed surface of the substrate 200, using a salicide process, and using the first mask layer 214 and the second mask layer 202a as a mask.

A process for forming the electrical contact layer 205 can include the following process. A metal layer can be formed on the surface of the substrate 200, the second mask layer 202a and the memory cells 201. Metal atoms in the metal layer can be diffused into the exposed portion of the control gate layer 213 and the substrate 200, using an annealing process, to form the electrical contact layer 205. After the electrical contact layer 205 is formed, the metal layer can be removed.

The metal layer can be made of a material including nickel, cobalt, titanium, tantalum, or a combination thereof. A process for forming the metal layer can include a chemical liquid deposition process, a chemical vapor deposition process, and/or a physical vapor deposition process.

For example, when the metal layer is nickel, the process for forming the metal layer can include a chemical liquid deposition process. The parameters of the chemical liquid deposition process can include the following. The reaction solution can include a $NiSO_4$ solution, and one or more of a $(NH_4)_2SO_4$ solution, a $NH_4F$ solution and a $C_6H_5Na_3O_7$ solution. The molar concentration of $NiSO_4$ in the reaction solution can range from about 0.01 mol/L to about 1 mol/L. The reaction solution can have a PH value ranging from about 8 to about 10, a deposition time ranging from about 30 seconds to about 3000 seconds, and a deposition temperature ranging from about 0° C. to about 90° C.

Because the second mask layer 202a can expose the sidewall surface of the control gate layer 213, the metal layer can be formed on the sidewall surface of the control gate layer 213. The metal atoms in the metal layer can diffuse from the exposed sidewall of the control gate layer 213 into the interior of the control gate layer 213, and can react with the material of the control gate layer 213 to form a metal silicide layer that forms the electrical contact layer 205. Because the electrical contact layer 205 is formed on the control gate layer 213, the total resistivity of the electrical contact layer 205 and the control gate layer 213 can be less than the total resistivity of the control gate layer 213 that does not have the electrical contact layer 205. Thus, the total resistivity of the control gate of the memory device can be reduced by forming the electrical contact layer 205. Therefore, Accordingly, the energy consumption and heat loss of the memory cells 201 can be reduced, and performance of the memory cells 201 can be improved.

Before the salicide process, a portion of the control gate layer 213 can be etched using the second mask layer 202a and the first mask layer 214 as a mask, such that the exposed sidewall surface of the control gate layer 213 can be recessed with respect to the sidewall of the first mask layer 214, and the size of the exposed portion of the control gate layer 213 in the direction parallel to the surface of the substrate 200 can be reduced. Therefore, during the forming of the electrical contact layer, by controlling the thickness of the electrical contact layer 205, it can be ensured that the surface of the electrical contact layer 205 can be flat (i.e., even, or uniform) or recessed relative to the first mask layer 214.

In one embodiment, the surface of the electrical contact layer 205 can be recessed relative to the first mask layer 214. During the subsequent forming of the conductive structure, the first mask layer 214 can protect the electrical contact layer 205, to prevent the electrical contact layer 205 and the conductive structure from having too small a distance in between or contacting each other. In one embodiment, the electrical contact layer 205 can be formed in the portion of the control gate layer 213 (i.e., the portion of the control gate layer 213 contacting the metal layer). In addition, the electrical contact layer 205 can surround the remaining portion of the control gate layer 213.

The annealing process can include rapid thermal annealing, spike annealing (i.e., spike thermal annealing), and/or laser thermal annealing. For example, when rapid thermal annealing is being used, the rapid thermal annealing can have a temperature ranging from about 200° C. to about 500° C., a time (i.e., an annealing time) ranging from about 10 seconds to about 120 seconds, and a protective gas including nitrogen and/or an inert gas. When spike annealing is used, the spike annealing can have a temperature ranging from about 300° C. to about 600° C., and a protective gas including nitrogen and/or an inert gas. When laser thermal annealing is being used, the laser thermal annealing can have a temperature ranging from about 500° C. to about 900° C., an annealing time ranging from about 0.1 ms to about 2 ms, and a protective gas including nitrogen and/or an inert gas. The thickness of the formed electrical contact layer 205 can be correlated with the annealing time. The thickness of the formed electrical contact layer 205 can be increased with the increasing of the annealing time.

During the annealing process, the metal atoms in the metal layer can diffuse into the control gate layer 213 that is in contact with the metal layer. The metal atoms can react with the polysilicon material of the control gate layer 213 to form a metal silicide material. In one embodiment, the formed electrical contact layer 205 can be made of a material including nickel silicide, cobalt silicide, titanium silicide, tantalum silicide, or a combination thereof. In one embodiment, the portion of the control gate layer 213 that is close to (i.e., adjacent to) the sidewall surface of the control gate layer 213 can be doped with the metal atoms to form the electrical contact layer 205.

Further, because the metal atoms can diffuse into the control gate layer 213 and can diffuse into the portion of the control gate layer 213 that is covered by the second mask layer 202a, the formed electrical contact layer 205 can also be located on the surface of the portion of the control gate layer 213 that is covered by the second mask layer 202a. In one embodiment, after the annealing process, the electrical contact layer 205 can be formed on the sidewall surface of the control gate layer 213 from the first mask layer 214 to the second dielectric layer 212.

In one embodiment, the second mask layer 202a can further expose the surface of the substrate 200 on both sides of the memory cell 201. Thus, after the salicide process, the electrical contact layer 205 can also be formed on the surface of the substrate 200 on both sides of the memory cell 201. The substrate 200 on both sides of the memory cell 201 can have the doped region(s) 203. Therefore, the electrical contact layer 205 formed in the substrate 200 can be located at the surface of the doped region 203. The electrical contact layer 205 at the surface of the doped region 203 can be used for contacting the subsequently-formed conductive structure, to reduce the contact resistance between the conductive structure and the doped region 203.

After the salicide process is completed, the metal layer may need to be removed in order to continue with subsequent processes. A process for removing the remaining metal layer can include a dry etching process and/or a wet etching process. In one embodiment, the process for removing the remaining metal layer can include a wet etching process. The wet etching process can have a desired selectivity, and can substantially completely remove the remaining metal layer without damaging the first mask layer 214, the memory cells 201 and the metal silicide layer, i.e., the electrical contact layer 205.

Figure 8:
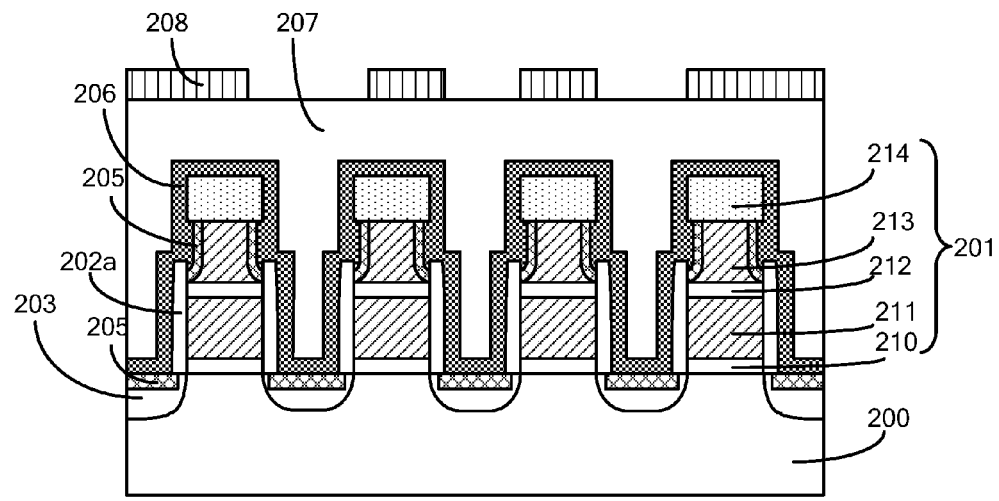

In Step S107 of FIG. 11 and referring to FIG. 8, a barrier layer 206 is formed on the surface of the substrate 200, the memory cells 201 and the second mask layer 202*a*. A third dielectric layer 207 can be formed on the surface of the barrier layer 206. A patterned layer 208 can be formed on the surface of the third dielectric layer 207. The patterned layer 208 can expose the electrical contact layer 205 on the surface of the substrate 200, and position(s) corresponding to a portion of the memory cell(s) 201.

A conductive structure can be subsequently formed in the third dielectric layer 207. The barrier layer 206 can be used as an etch stop layer during the subsequent etching to form an opening, and can be used for electrically isolating the subsequently-formed conductive structure and the sidewall of the memory cells 201.

Although the third dielectric layer 207 is shown, e.g., in FIG. 8, the third dielectric layer 207 is optional. Using appropriate fabrication processes, without the forming of the third dielectric layer 207, the opening can be formed between adjacent memory cells 201, and the conductive structure can be subsequently formed in the opening. Various advantages and functions provided by the disclosed methods and device structures can be achieved with or without the third dielectric layer 207.

The third dielectric layer 207 can be made of a material including silicon oxide, silicon nitride, silicon oxynitride, a low-K dielectric material, or a combination thereof. Subsequently, in order to form the conductive structure using the self-aligned electrical contact process, opening(s) may need to be formed in the third dielectric layer 207. The barrier layer 206 can be used as a stop layer during the etching of the opening. Therefore, the material of the third dielectric layer 207 can be different from the material of the barrier layer 206, such that there can be an etching selectivity between the third dielectric layer 207 and the barrier layer 206.

The barrier layer 206 can be made of a material including silicon oxide, silicon nitride, silicon oxynitride or a combination thereof. In one embodiment, the barrier layer 206 can be made of a material including silicon nitride. A process for forming the barrier layer 206 can include a chemical vapor deposition process, a physical vapor deposition process, and/or an atomic layer deposition process. In one embodiment, the process for forming the barrier layer 206 can include a plasma-enhanced chemical vapor deposition (PECVD) process.

The third dielectric layer 207 can be made of a material including silicon oxide, silicon nitride, silicon oxynitride, a low-K dielectric material, or a combination thereof. In addition, the material of the third dielectric layer 207 can be different from the material of the barrier layer 206, such that there can be an etching selectivity between the third dielectric layer 207 and the barrier layer 206.

A process for forming the third dielectric layer 207 can include the follow process. A third dielectric film can be formed on the surface of the barrier layer 206 to fill trench(es) between adjacent memory cells 201, using a deposition process. The third dielectric film can be planarized using a chemical mechanical polishing (CMP) process, to form the third dielectric layer 207. The deposition process for depositing the third dielectric film can include a chemical vapor deposition process and/or a physical vapor deposition process.

The patterned layer 208 can include a photoresist layer that is previously exposed and developed, and can be used for defining the location of subsequently-formed opening(s). In one embodiment, a process for subsequently forming the conductive structure can include a self-aligned contact process. In addition to exposing the region(s) between adjacent memory cells 201, the patterned layer 208 can further expose a portion of the region(s) corresponding to the memory cells 201. Therefore, the patterned layer 208 can expose regions having a relatively larger area. Thus, the requirement for exposure accuracy of forming the photoresist layer (i.e., the patterned layer 208) can be reduced, which can be beneficial for forming memory devices having a high degree of integration and a high device density.

Figure 9:
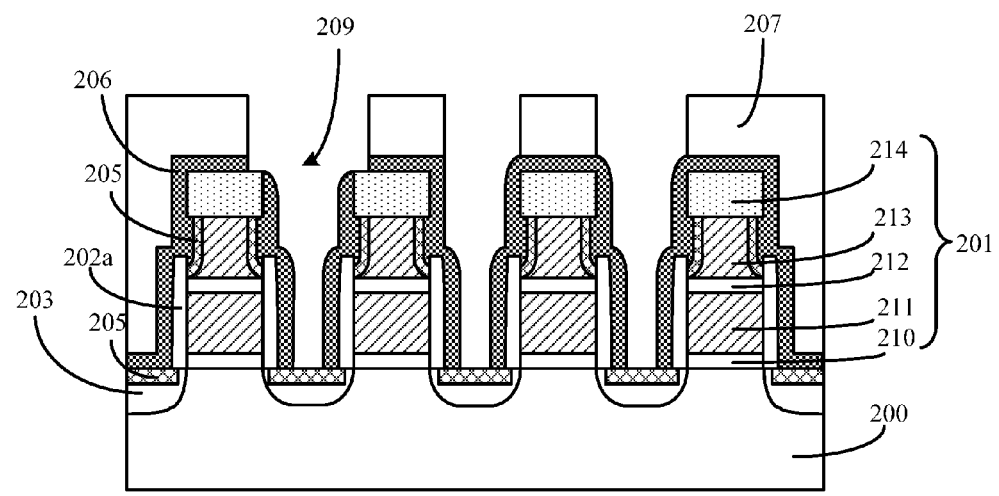

In Step S108 of FIG. 11 and referring to FIG. 9, the third dielectric layer 207 is etched using the patterned layer 208 (as shown in FIG. 8) as an etching mask, until the barrier layer 206 is exposed, to form opening(s) 209. The openings 209 can expose at least the electrical contact layer 205 on the surface of the substrate 200 on both sides of the memory cell 101. That is, the openings 209 can expose at least the positions corresponding to the electrical contact layer 205 on the surface of the substrate 200 on both sides of the memory cell 101.

The barrier layer 206 at the bottom of the opening 209 can be removed, until the electrical contact layer 205 on the surface of the substrate 200 is exposed. After the barrier layer 206 at the bottom of the opening 209 is removed, the patterned layer 208 can be removed.

A process for etching the third dielectric layer 207 can include an anisotropic dry etching process. The anisotropic dry etching process can be stopped at the surface of the barrier layer 206. The anisotropic dry etching process can have an etching direction perpendicular to the surface of the substrate 200, and can have an etching gas bombarding the substrate 200 in a direction perpendicular to the surface of the substrate 200. Therefore, the portion of the barrier layer 206 that is located on the sidewall surface of the memory cell 201 can be retained. The portion of the barrier layer 206 that is located on the sidewall surface of the memory cell 201 can be used for electrically isolating the subsequently-formed conductive structure from the memory cell 201.

After the barrier layer 206 is exposed, the barrier layer 206 at the bottom of the opening 209 can be etched, such that the electrical contact layer 205 at the surface of the substrate 200 at both sides of the memory cell 201 can be exposed. Thus, the conductive structure subsequently formed in the opening 209 can be connected to, or be in contact with, the electrical contact layer 205.

A process for etching the barrier layer 206 can include a dry etching process and/or a wet etching process. In one embodiment, the process for etching the barrier layer 206 can include an anisotropic dry etching process. Because during the anisotropic dry etching process, an etching gas can bombard the substrate 200 in the direction perpendicular to the surface of the substrate 200, the barrier layer 206 on the surface of the substrate 200 can be removed. Meanwhile, the portion of the barrier layer 206 located on the sidewall surface of the memory cell 201 can be retained.

In one embodiment, in the memory cell 201, the electrical contact layer 205 can be formed on the sidewall surface of the control gate layer 213. Further, the surface of the electrical contact layer 205 can be flat or recessed relative to the sidewall surface of first mask layer 214. Thus, during the etching of the barrier layer 206, the first mask layer 214 can prevent a situation where the barrier layer 206 on the top of the electrical contact layer 205 is removed by the anisotropic dry etching process. Accordingly, it can be ensured that, after the etching of the barrier layer 206, the electrical contact layer 205 on the sidewall surface of the control gate layer 213 can be substantially completely covered by the surrounding barrier layer 206. Accordingly, desired electrical isolation performance can be achieved between the conductive structure subsequently formed in the opening 209 and the electrical contact layer 205. Thus, leakage current can be difficult to produce, and the formed memory cells can have stable performance.

In Step S109 of FIG. 11 and referring to FIG. 10, a conductive structure 210 is formed in the opening 209 (as shown in FIG. 9). As shown in FIG. 10, the conductive structure can connect to the gate structure through the substrate. In other words, the conductive structure can be separated or isolated from the gate structure by the substrate.

For example, a method for forming the conductive structure 210 can include the following process. A conductive layer can be formed on the surface of the third dielectric layer 207 and in the opening 209. The conductive layer can substantially fill the opening 209. The conductive layer can be planarized using a CMP process, until the surface of the third dielectric layer 207 is exposed.

The conductive layer can be made of a material including a metal, e.g., copper, tungsten, and/or aluminum. A process for forming the conductive layer can include a deposition process and/or an electroplating process. The formed conductive structure 210 can be located on the surface of the barrier layer 206 and on the surface of the electrical contact layer 205 in the substrate 200. The conductive structure 210 can be connected to the doped region 203 via the electrical contact layer 205, and can be used for controlling the turning on or turning off of the channel region at the bottom of the memory cell 201, such that the conductive structure 210 can select a certain memory cell 201 that can be used for implementing operations including writing, erasing, programming, or the like. That is, the conductive structure 210 can be the selection gate or bit line of the formed memory device.

In one embodiment, a stop layer can be formed between the conductive structure 210 and the surface of both of the sidewall and the bottom of the opening 209. The stop layer can be made of a material including titanium nitride, tantalum nitride, or a combination thereof. The stop layer can be used as the stop position of the CMP process.

Because the size of the control gate layer 213 in the direction parallel to the surface of the substrate 200 can be reduced by an isotropic etching process, the sidewall surface of the electrical contact layer 205 that is formed on the sidewall surface of the control gate layer 213 can be recessed relative to the sidewall surface of the floating gate layer 211 and of the first mask layer 214. Thus, the distance from the sidewall of the electrical contact layer 205 to the conductive structure 210 can be relatively large. Moreover, the sidewall of the electrical contact layer 205 and the conductive structure 210 can be electrically isolated by the barrier layer 206 therebetween. Therefore, the thickness of the barrier layer 206 used for electrical isolation can be increased. Accordingly, the breakdown voltage between the sidewall of the electrical contact layer 205 and the conductive structure 210 can be increased. Thus, the sidewall of the electrical contact layer 205 and the conductive structure 210 can be prevented from generating a leakage current in between due to the breakdown phenomenon, so the formed device structure can have stable performance and improved reliability.

In the method for forming a memory device according to various embodiments, a second mask layer can be formed on the sidewall surface of a memory cell. The second mask layer can cover the sidewall of a first dielectric layer, a floating gate layer and a second dielectric layer. Further, the second mask layer can cover a portion of a control gate layer close to the floating gate layer. Before an electrical contact layer is formed, a portion of the control gate layer can be removed using a first mask (or a first mask layer) and a second mask (or a second mask layer) as a mask, such that the size of an exposed portion of the control gate layer in a direction parallel to the surface of the substrate can be reduced.

Because the size of the exposed portion of the control gate layer in the direction parallel to the surface of the substrate is reduced, i.e., the exposed sidewall of the control gate layer can be recessed with respect to the sidewall of the floating gate layer and the sidewall of the first mask layer, after the electrical contact layer is formed using a salicide process, the surface of the electrical contact layer is not protruded beyond the sidewall surface of the floating gate layer and the sidewall surface of the first mask layer, such that the first mask layer can substantially completely cover the electrical contact layer on the sidewall surface of the control gate layer. Accordingly, during the subsequent forming of an opening in a third dielectric layer, the electrical contact layer located on the sidewall surface of the control gate layer can be protected by the first mask layer and a barrier layer, such that the sidewall of the opening does not expose the electrical contact layer. Further, there can be a barrier layer having a sufficient thickness on the surface of the electrical contact layer for isolating a subsequently-formed conductive structure. Accordingly, after the conductive structure is subsequent formed, there can be desired electrical isolation between the conductive structure and the electrical contact layer on the sidewall surface of the control gate layer. A leakage current is less likely to be generated. Thus, the formed memory device can have stable performance and improved reliability.

Accordingly, various embodiments also provide memory device, or structure of memory devices, that are formed using the methods described above in various disclosed embodiments. Still referring to FIG. 10, an exemplary device can include a substrate 200. The surface of the substrate 200 has one or more memory cells 201 thereon. A memory cell 201 can include a first dielectric layer 210 on the surface of the substrate 200, a floating gate layer 211 on the surface of the first dielectric layer 210, a second dielectric layer 212 on the surface of the floating gate layer 211, a control gate layer 213 on the surface of the second dielectric layer 212, and a first mask layer 214 on the surface of the control gate layer 213.

The device can further include a second mask layer 202a on the sidewall surface of the memory cell 201. The second mask layer 202a can cover the sidewall of the first dielectric layer 210, the floating gate layer 211 and the second dielectric layer 212, and a portion of the sidewall of the control gate layer 213 that is close to the floating gate layer 211. In the direction parallel to the surface of the substrate 200, the size of the portion of the control gate layer 213 that is exposed by the first mask layer 214 and the second mask layer 202a can be smaller than the size of the floating gate layer 211 or the first mask layer 214.

The device can further include an electrical contact layer 205 on the exposed portion of the sidewall surface of the control gate layer 213 and on the exposed surface of the substrate 200. The device can further include a barrier layer 206 formed on the surface of the substrate 200, the memory cells 201 and the second mask layer 202a.

The device can further include a third dielectric layer 207 located on the surface of the barrier layer 206. The third dielectric layer 207 can have an opening therein (not shown). The opening can expose at least the electrical contact layer 205 on the surface of the substrate 200 on both sides of the memory cell 101. The device can further include a conductive structure 210 formed in the opening.

In one embodiment, the electrical contact layer 205 can be made of a material including nickel silicide, cobalt silicide, titanium silicide, tantalum silicide, or a combination thereof. The barrier layer 206 can be made of a material including silicon nitride. The surface of the electrical contact layer 205 on the sidewall of the control gate layer 213 can be flat or recessed relative to the sidewall of first mask layer 214.

In one embodiment, the electrical contact layer 205 can be located on the portion of the sidewall surface of the control gate layer 213 that is close to the first mask layer 214. In another embodiment, the electrical contact layer 205 can be located on the sidewall surface of the control gate layer 213 from the first mask layer 214 to the control gate layer 213.

In the device or structure as disclosed in various embodiments, in the direction parallel to the surface of the substrate, the size of the portion of the control gate layer 213 that is exposed by the first mask (or the first mask layer) and the second mask (or the second mask layer) can be smaller than the size of the floating gate layer or the first mask layer. That is, the exposed sidewall of the control gate layer can be recessed with respect to the sidewall of the floating gate layer and the sidewall of the first mask layer. Accordingly, the surface of the electrical contact layer that is located on the exposed sidewall surface of the control gate layer is not protruded beyond the sidewall surface of the floating gate layer or the sidewall surface of the first mask layer. Therefore, the first mask layer can substantially completely cover the electrical contact layer on the sidewall surface of the control gate layer.

Thus, the distance between the conductive structure and the control gate layer can be significantly and sufficiently larger than the distance between the conductive structure and the gate structure, such that, after an electrical contact layer and a barrier layer are subsequently formed, the electrical contact layer and the conductive structure do not directly contact each other and can have sufficient isolation therebetween, where the barrier layer can form an isolation layer between the conductive structure and the control gate layer.

Further, the barrier layer can have a sufficient thickness on the surface of the electrical contact layer for isolating the subsequently-formed conductive structure. Accordingly, there can be desired electrical isolation between the conductive structure and the electrical contact layer on the sidewall surface of the control gate layer. A leakage current is less likely to be generated. Thus, the memory device can have stable performance and improved reliability.

In certain embodiments, a method for forming a memory device is provided. The method can include processes as depicted in the various embodiments as described above, e.g., as shown in FIGS. 2-3, 5, 7, and 9-10.

Optionally, the floating gate layer can be made of a material including polysilicon. The second dielectric layer can be made of an insulating material. The first mask layer can be a hard mask and can be made of a material including silicon nitride. The second mask sidewall spacers can be made of a material including silicon oxide. Using the sacrificial layer as an etching mask, the second mask sidewall spacers can be partially etched to form a second mask layer. The portion of the control gate layer that is covered by the second mask layer can have a thickness greater than about ⅕ of the total thickness of the control gate layer.

A process for forming the sacrificial layer can include the following steps. A sacrificial film can be formed on the surface of the substrate, the memory cells and the second mask sidewall spacers. The sacrificial film can be made of a material including a bottom anti-reflective coating (BARC) or any other appropriate organic layer. The BARC film can be etched back, to form the sacrificial layer. A process for etching the second mask sidewall spacers can include an isotropic etching process.

A process for forming the electrical contact layer can include forming a metal layer on the surface of the substrate, the second mask layer and the memory cells, and then diffusing metal atoms in the metal layer using an annealing process, to form the electrical contact layer. After the electrical contact layer is formed, the metal layer can be removed. A process for removing the remaining metal layer can include a wet etching process.

The barrier layer can be used as an etch stop layer during the subsequent etching to form an opening. The barrier layer can be made of a material including silicon nitride. The third dielectric layer can be made of an insulating material.

In certain embodiments, another method for forming a memory device is provided. The method can include processes as depicted in the various embodiments as described above, e.g., as shown in FIGS. 2-3, 5 and 7-10.

As shown in FIG. 5, during the removing of the upper portion of the control gate layer, the floating gate layer is not etched. The floating gate layer and the control gate layer can be made of a material including polysilicon. After the electrical contact layer is formed, in the direction parallel to the surface of the substrate, the size (or the critical dimension) of the exposed portion of the control gate layer can be less than the size (or the critical dimension) of the floating gate layer.

As shown in FIG. 8, a barrier layer can be formed to be used as an etch stop layer. A third dielectric layer can be formed via a process including a CMP process. As shown in FIG. 10, a self-aligned contact (i.e., the conductive structure) can be formed on the source region and/or the drain region. The self-aligned contact can have desired isolation from the control gate salicide (i.e., the electrical contact layer).

Optionally, the process for partially removing the second mask sidewall spacers can include forming a sacrificial layer, etching back the second mask sidewall spacers using a first isotropic etching process to remove the exposed second mask sidewall spacers. A second isotropic etching process can be used for recessing the exposed portion of the control gate.

Optionally, the sacrificial layer can be made of a material including amorphous carbon, and/or a bottom anti-reflective coating material. Optionally, the first isotropic etching process can include a wet etching process based on hydrofluoric acid (HF).

Optionally, the second isotropic etching process can include a wet etching process using an etching solution containing tetramethyl ammonium hydroxide, or can use a mixed solution of nitric acid and hydrofluoric acid. Optionally, the first isotropic etching process and the second isotropic etching process can include an isotropic dry etching process using fluorine-base plasma etching.

In certain embodiments, a memory device is provided. The memory device can include a memory cell as depicted in FIG. 10. The memory cell can include a floating gate layer and a control gate layer having a second dielectric layer in between. The top or upper portion of the control gate layer can include two sidewalls made by a salicide process and polysilicon in between the two sidewalls, i.e., in the middle of the control gate layer. The size (or the critical dimension) of the exposed portion of the control gate layer with sidewalls (made by the salicide process) can be less than or equal to the size (or the critical dimension) of the floating gate layer. The source region and the drain region of the memory device can be formed with a process including the salicide process. The portion of the source/drain region made by the salicide process can form the electrical contact layer.

Optionally, the formed electrical contact layer can be made of a material including nickel silicide, cobalt silicide, or titanium silicide. Optionally, the electrical contact layer can be located on the sidewall of the control gate layer from the first mask layer to the second dielectric layer.

Optionally, the device can further include a self-aligned contact, i.e., a conductive structure. The self-aligned contact can have desired isolation from the electrical contact layer on the sidewall of the control gate layer via a barrier layer. Optionally, the barrier layer can be made of a material including silicon nitride.

As used herein, relational terms such as 'first' and 'second' are merely used for differentiate one element or operation from another element or operation, and do not require or imply that any actual relationship or order as such exist between these elements or operations. In addition, the terms "include", "comprise", "contain", or any other variations thereof, are intended to cover a non-exclusive inclusion, such that a process, method, article, or apparatus that includes a series of elements can not only include those elements, but also include other elements not expressly listed, or inherent elements for such a process, method, article, or apparatus. Without further limitation, an element defined by a statement "include one . . . " does not exclude additional identical elements that may be included in the process, method, article, or apparatus that includes the element.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A memory device, comprising:
a substrate;
one or more adjacent memory cells on the substrate, a memory cell of which includes a gate structure on the substrate, a control gate layer on the gate structure, and a first mask layer on the control gate layer, wherein, in a direction parallel to a surface of the substrate, a size of a first portion of the control gate layer being smaller than a size of the gate structure or the first mask layer;
an electrical contact layer on a sidewall of the first portion of the control gate layer and on an exposed surface of the substrate;
a barrier layer on the substrate and a sidewall of the memory cell, wherein the barrier layer has an opening therein, the opening exposing at least the electrical contact layer on the surface of the substrate on both sides of the memory cell; and
a conductive structure in the opening, such that a distance between the conductive structure and the control gate layer is significantly larger than a distance between the conductive structure and the gate structure, and the barrier layer forms an isolation layer between the conductive structure and the control gate layer.

2. The device according to claim 1, wherein:
the gate structure includes a first dielectric layer on the substrate, a floating gate layer on the first dielectric layer, and a second dielectric layer on the floating gate layer; and
the device further includes:
a second mask layer on the sidewall of the memory cell, the second mask layer covering a sidewall of the gate structure and covering a lower portion of a sidewall of the control gate layer that is on the gate structure; and
a third dielectric layer on the barrier layer, wherein the opening is formed in the barrier layer and the third dielectric layer.

3. The device according to claim 2, wherein the electrical contact layer is located on the sidewall of the first portion of the control gate layer from the first mask layer to the second dielectric layer.

4. The device according to claim 2, wherein:
the electrical contact layer is made of a material including nickel silicide, cobalt silicide, titanium silicide, tantalum silicide, or a combination thereof.

5. The device according to claim 2, wherein:
the lower portion of the control gate layer that is covered by the second mask layer has a thickness greater than about 1/5 of a total thickness of the first portion of the control gate layer.

6. The device according to claim 2, wherein:
the first dielectric layer is made of a material including silicon oxide;
the second dielectric layer is made of a material including silicon oxide, silicon nitride, silicon oxynitride, or a combination thereof; and
the floating gate layer and the control gate layer are made of a material including polysilicon.

7. The device according to claim 2, wherein:
the substrate on both sides of the memory cell has a doped region, the electrical contact layer on the substrate is located at a surface of the doped region, and the doped region contains P-type ions or N-type ions.

8. The device according to claim 2, wherein:
the first mask layer and the second mask layer are made of a material including silicon oxide, silicon nitride, silicon oxynitride, or a combination thereof, and the material of the first mask layer is different from the material of the second mask layer.

9. The device according to claim 2, wherein:
the barrier layer is made of a material including silicon oxide, silicon nitride, silicon oxynitride, or a combination thereof.

10. The device according to claim 2, wherein:
the third dielectric layer is made of a material including silicon oxide, silicon nitride, silicon oxynitride, a low-K dielectric material, or a combination thereof, and the material of the third dielectric layer is different from the material of the barrier layer.

* * * * *